(12) United States Patent
Baumgartner et al.

(10) Patent No.: US 8,327,302 B2
(45) Date of Patent: *Dec. 4, 2012

(54) TECHNIQUES FOR ANALYSIS OF LOGIC DESIGNS WITH TRANSIENT LOGIC

(75) Inventors: Jason R. Baumgartner, Austin, TX (US); Michael L. Case, Pflugerville, TX (US); Robert L. Kanzelman, Rochester, MN (US); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 524 days.

This patent is subject to a terminal disclaimer.

(21) Appl. No.: 12/580,330

(22) Filed: Oct. 16, 2009

(65) Prior Publication Data

US 2011/0093825 A1    Apr. 21, 2011

(51) Int. Cl.
*G06F 17/50* (2006.01)
(52) U.S. Cl. ........ 716/101; 716/103; 716/104; 716/106; 716/108; 716/113; 716/115; 716/136
(58) Field of Classification Search .......... 716/100–108, 716/113–115, 136
See application file for complete search history.

(56) References Cited

U.S. PATENT DOCUMENTS

| | | | |
|---|---|---|---|
| 6,691,078 B1 | 2/2004 | Beer et al. | |
| 6,920,583 B1 | 7/2005 | Morley et al. | |
| 6,944,838 B2 | 9/2005 | McMillan | |
| 6,973,420 B1 | 12/2005 | Tetzlaff | |
| 6,975,976 B1 | 12/2005 | Casavant et al. | |
| 7,120,883 B1 | 10/2006 | Antwerpen | |
| 7,159,198 B1 | 1/2007 | Ip et al. | |
| 7,181,703 B1 | 2/2007 | Borer | |
| 7,203,915 B2 | 4/2007 | Baumgartner et al. | |
| 7,203,919 B2 | 4/2007 | Suaris | |
| 7,340,702 B2 | 3/2008 | Wang | |
| 7,383,166 B2 | 6/2008 | Ashar et al. | |
| 7,403,884 B2 | 7/2008 | Hemmett | |
| 7,412,674 B1 | 8/2008 | Singhal et al. | |
| 7,412,695 B1 | 8/2008 | Dastidar et al. | |
| 7,421,669 B2 | 9/2008 | Baumgartner et al. | |
| 2002/0040465 A1* | 4/2002 | Kimura et al. | 716/5 |
| 2004/0044510 A1* | 3/2004 | Zolotov et al. | 703/14 |
| 2005/0193304 A1 | 9/2005 | Abraham et al. | |
| 2005/0262456 A1* | 11/2005 | Prasad | 716/4 |
| 2005/0268265 A1* | 12/2005 | Ly et al. | 716/6 |
| 2005/0273307 A1 | 12/2005 | Hemmett | |
| 2006/0236275 A1* | 10/2006 | Groos | 716/4 |
| 2007/0050740 A1 | 3/2007 | Jacobi et al. | |

(Continued)

OTHER PUBLICATIONS

Baumgartner et al, U.S. Appl. No. 12/872,490, 'Techniques for Employing Retiming and Transient Simplification on Netlists That Include Memory Arrays', Jason R. Baumgartner, filed Aug. 31, 2010.

(Continued)

*Primary Examiner* — Paul Dinh
(74) *Attorney, Agent, or Firm* — Yudell Isidore Ng Russell PLLC

(57) ABSTRACT

A technique for performing an analysis of a logic design includes detecting an initial transient behavior in a logic design embodied in a netlist. A duration of the initial transient behavior is also determined. Reduction information on the logic design is gathered based on the initial transient behavior. The netlist is then modified based on the reduction information.

17 Claims, 3 Drawing Sheets

U.S. PATENT DOCUMENTS

| | | | |
|---|---|---|---|
| 2007/0226666 A1* | 9/2007 | Ganai et al. | 716/5 |
| 2008/0028347 A1 | 1/2008 | Hiraoglu | |
| 2008/0066034 A1 | 3/2008 | Baumgartner et al. | |
| 2008/0127002 A1 | 5/2008 | Baumgartner et al. | |
| 2008/0275679 A1 | 11/2008 | Lin et al. | |
| 2010/0107132 A1 | 4/2010 | Bjesse | |
| 2010/0218150 A1 | 8/2010 | Baumgartner et al. | |
| 2010/0223584 A1 | 9/2010 | Baumgartner et al. | |

OTHER PUBLICATIONS

Lee, Eric—Non-Final Office Action dated Aug. 3, 2011; U.S. Appl. No. 12/394,560.

Gott, R.M. et al., Functional Formal Verification on Designs of Series Microprocessors and Communication Subsystems, IBM J. Res & Dev., vol. 49 No. 4/5, pp. 565-580, 2005.

Thuyen et al., Formal Verification of a Pervasive Interconnect Bus System in a High-Performance Microprocessor, Design, Automation & Test in Europe Conference & Exhibition, Apr. 16-20, 2007, pp. 1-6, IEEE.

Biere et al., 'Linear Encodings of Bounded LTL Model Checking', Logical Methods in Computer Science, vol. 2 pp. 1-64, 2006.

Schuppan, 'Liveness Checking as Safety Checking to Find Shortest Counterexamples to Linear Time Properties', Doctoral Thesis ETH No. 16268, Submitted to Swiss Federal Institute of Tecynology, Zurich, 2005.

Schuppan et al., 'Liveness Checking as Safety Checking for Infinite State Spaces', Electronic notes in Theoretical Computer Science, Infinity 2005, www.elsevier.nl/locate/entcs, pp. 1-18.

Burch, J., 'Verifying Liveness Properties by Verifying Safety Properties', LNCS (SpringerLlnk), Computer-Aided Verification, vol. 531/1991, pp. 224-232, Springer Berlin/Heidelberg, 1991.

Zang, et al; "A BDD-Based Algorithm for Analysis of Multistate Systems with Multistate Components"; IEEE Transactions on Computers; vol. 52; No. 12; Dec. 2003.

Jin, et al; "Power System Transient Stability Design using Reachability based Stability-Region Computation"; IEEE; pp. 338-342; 2005.

Tadmor, et al; "Shift Modes and Transient Dynamics in Low Order, Design Oriented Galerkin Models"; 45th AIAA Aerospace Sciences Meeting and Exhibit 8-11; Reno, Nevada; 2007; pp. 1-11.

Costa, Ramon R.; "Improving Transient Behavior of Model-Reference Adaptive Control"; Proceedings of the American Control Conference; San Diego, CA; Jun. 1999; pp. 576-580.

WIPO, International Search Report dated Feb. 15, 2011, International App. No. PCT/EP2010/064814.

Kitchen et al: "Temporal Decomposition for Logic Optimization"; Proceedings 2005 International Conference on Computer Design in San Jose, CA—USA; IEEE Oct. 2, 2005; pp. 697-702.

Lu et al: "Sequential Equivalence Checking Based on K-th Invariants and Circuit SAT Solving"; High-Level Design Validation and Test Workshop, 2005; 10th IEEE International—Nov. 30-Dec. 2, 2005; IEEE Nov. 30, 2005; pp. 45-51.

Case et al: "Enhanced Verification by Temporal Decomposition"; Formal Methods in Computer-Aided Design, 2009; FMCAD 2009; IEEE Nov. 15, 2009; pp. 17-24.

* cited by examiner

TECHNIQUES FOR ANALYSIS OF LOGIC DESIGNS WITH TRANSIENT LOGIC

BACKGROUND

1. Field

This disclosure relates generally to integrated circuit logic design analysis and, more specifically, to techniques for analysis of integrated circuit logic designs with transient logic.

2. Related Art

In general, formal verification involves rigorously proving that an integrated circuit (IC) logic design (design) satisfies an associated specification. Typically, the specification of a verification problem includes a netlist representation of a design and a set of expected values for specified nets of the netlist. A 'netlist' comprises gates of various functions (which evaluate to Boolean values over time) and edges (which represent interconnections between the gates). A 'trace' may be a sequence of binary (i.e., '0' or '1') values to gates over time or a sequence of ternary values (i.e., '0', '1', or 'X', where value 'X' refers to an unknown value) to gates over time.

A gate may, for example, fall into one of four broad functional categories: constant gates, random gates, combinational gates, and state elements (e.g., registers and sequential gates, such as latches and flip-flops). A constant gate produces a logic level that does not vary with time. A random gate (also referred to as a primary input) may assume any logic level in any time-step independent of all other gates. A combinational gate is a logical element such as an AND gate, an OR gate, a NAND gate, a NOR gate, etc. A sequential gate has an associated initial value function and a next state function. The value of a sequential gate at time '0' (t0) is the value of the initial value function. The value of a sequential gate at time 'i+1' is equal to the value of the next state function of the sequential gate at time 'i'.

As an example, a verification problem may include determining whether a state exists in which a particular signal is asserted, where assertion of the particular signal indicates a fault. Using formal verification, an attempt is made to find a counter-example trace that includes a sequence of net values over time (states) that leads to an assertion of a particular signal or prove that no counter-example trace exists that leads to the assertion of the particular signal. Formal verification is often performed using state space search algorithms, which include unbounded and bounded exhaustive search algorithms. Bounded exhaustive search algorithms attempt to find an assertion of a particular signal that occurs within 'N' time-steps from an initial state of a design. Unbounded exhaustive search algorithms increase 'N' until no states are encountered that have not already been encountered for smaller values of 'N' (a condition referred to as a 'fixed-point'). If no path from an initial state to a violating state (i.e., a state in which the particular signal is asserted) is encountered before the fixed-point is reached, then correctness of a design can be inferred.

The number of verification cycles required to perform an exhaustive state space search increases exponentially with the number of state elements (e.g., registers, latches, flip-flops, etc.). This exponential relationship makes formal verification impractical for designs containing a large number of state elements (e.g., one-hundred or more state elements). As a result, semi-formal verification has been employed as a verification technique for large designs. Semi-formal verification leverages formal algorithms by applying the formal algorithms to larger designs in a resource-bounded manner. While requiring less computation time (as compared to formal verification), semi-formal verification may only achieve partial verification coverage.

SUMMARY

According to one aspect of the present disclosure, a technique for performing an analysis of a logic design includes detecting an initial transient behavior in a logic design embodied in a netlist. A duration of the initial transient behavior is determined. Reduction information on the logic design is gathered based on the initial transient behavior. The netlist is then modified based on the reduction information.

BRIEF DESCRIPTION OF THE DRAWINGS

The present invention is illustrated by way of example and is not intended to be limited by the accompanying figures, in which like references indicate similar elements. Elements in the figures are illustrated for simplicity and clarity and have not necessarily been drawn to scale.

DETAILED DESCRIPTION

Figure 1:
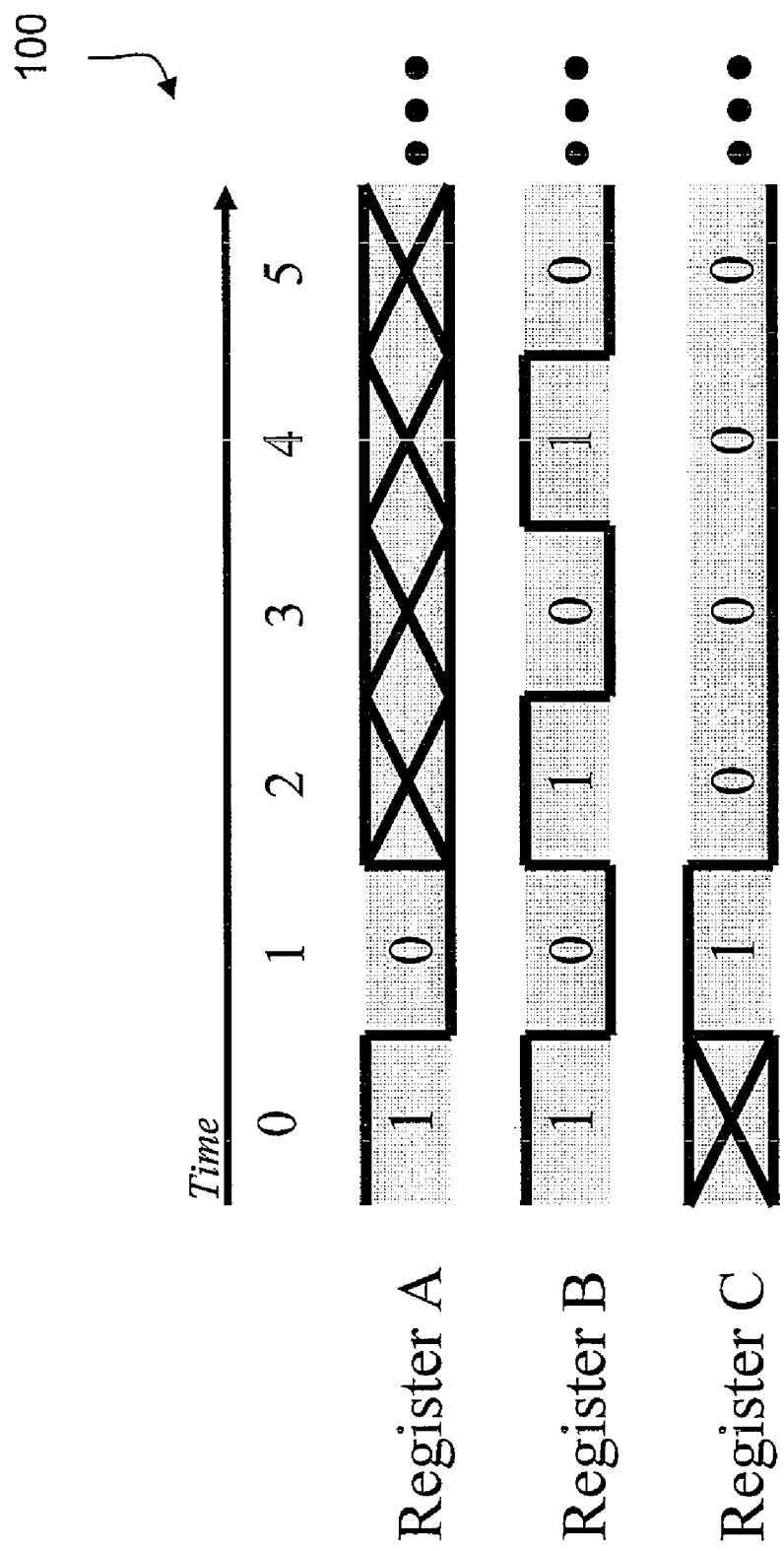
FIG. 1 is a signal diagram that illustrates states for three registers in a logic design

As will be appreciated by one of ordinary skill in the art, the present invention may be embodied as a method, system, or computer program product. Accordingly, the present invention may take the form of an entirely hardware embodiment, an entirely software embodiment (including firmware, resident software, microcode, etc.), or an embodiment combining software and hardware aspects that may all generally be referred to herein as a "circuit," "module," or "system." Furthermore, the present invention may take the form of a computer program product on a computer-usable storage medium having computer-usable program code embodied in the medium.

Any combination of one or more computer-usable or computer-readable storage medium(s) may be utilized. The computer-usable or computer-readable storage medium may be, for example, but is not limited to, an electronic, magnetic, optical, electromagnetic, infrared, or semiconductor system, apparatus, or device. More specific examples (a non-exhaustive list) of the computer-readable storage medium includes: a portable computer diskette, a hard disk, a random access memory (RAM), a read-only memory (ROM), an erasable programmable read-only memory (EPROM) or Flash memory, a portable compact disc read-only memory (CD-ROM), an optical storage device, or a magnetic storage device. It should be noted that the computer-usable or computer-readable storage medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this disclosure, a computer-usable or computer-readable storage medium may be any medium that can contain or store the program for use by or in connection with an instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in an object oriented programming language, such as Java, Smalltalk, C++, etc. However, the computer program code for carrying out operations of the present invention may also be written in conventional procedural programming languages, such as the "C" programming language or similar programming languages.

The present invention is described below with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operations to be performed on the computer or other programmable apparatus to produce a computer implemented process such that the instructions which execute on the computer or other programmable apparatus implement the functions/acts specified in the flowchart and/or block diagram block or blocks. As may be used herein, the term "coupled" includes both a direct electrical connection between blocks or components and an indirect electrical connection between blocks or components achieved using one or more intervening blocks or components.

A transient signal is a signal that assumes arbitrary logic values during a fixed number of time-steps after power-on (or the commencement of analysis). After the fixed number of time-steps, the transient signal settles and assumes a more restrictive behavior (e.g., a gate that initially toggles settles to a constant value for all future points in time, two gates that initialize differently become equivalent after a point in time, or a gate in a clock distribution tree may behave erratically for the first several time-steps and thereafter begin to toggle periodically). With reference to FIG. 1, a signal diagram 100 illustrates states for three registers in a logic design. In FIG. 1, a register is assigned '0' if its logic valuation is always equal to '0' or a '1' if its logic valuation is always equal to '1' for all possible input values at a specified time. If a ternary simulation is unable to determine a value for a register, the register is assigned value 'X'. In FIG. 1, register 'C' assumes value '0' at time '2' and remains '0' throughout the illustrated time-steps. When a register assumes a constant value for all time-steps greater than a particular time, the register is referred to as 'transient logic'. A transient duration corresponds to the number of time-steps before a transient signal settles to a constant value. As illustrated in FIG. 1, the transient duration of register 'C' is '2'.

Transient behavior of a logic design may be attributable to various causes. For example, transient behavior of a logic design may be the result of manual logic design, as a conservative post-reset initial state may contribute to a certain amount of transient design behavior that thereafter cannot be observed. As another example, transient behavior of a logic design may result from design styles that do not allow registers to have a fixed initial state (but instead require that many registers are initially interpreted to have a non-deterministic state). In this case, if a reset mechanism used in a design does not guarantee a fixed initial state for some registers, the initial state of the registers may be interpreted as having arbitrary random values at time '0'. Partial-reset mechanisms are often desirable as implementation of a partial-reset mechanism usually results in a reduced circuit size (as compared to frameworks that reset all registers). In order for a logic design (that implements a partial-reset mechanism) to function correctly, most registers of the design are brought to a deterministic state within a certain number of time-frames via an initialization sequence (which is a sequence of actions taken by the logic design after which all register values become deterministic). Before completion of the initialization sequence, the registers assume non-deterministic random values. The valuations seen during the initialization (start-up) phase may be unlike valuations observable after the initialization sequence terminates.

As yet another example, transient behavior of a logic design may be a result of the common practice of restricting behavior of a logic design during analysis. For example, logic designs are often equipped with configuration inputs (commonly referred to as 'chicken switches') that define modes of operation of the design. Upon initialization, the design processes the configuration inputs and then settles into a specified mode of operation. The register valuations seen in the desired mode of operation may be different than the valuations seen in the initialization phase. This initial transient behavior tends to render analysis of the respective design sub-optimal for several reasons. For example, in formal verification, the initial transient register valuations complicate efforts to characterize a set of reachable states. Furthermore, many gates in the logic design may only be needed in the initialization phase, and if the initialization phase could be removed the logic design could be made smaller. In simulation and hardware acceleration frameworks, redundant gates substantially slow the process of building a model (as well as subsequent analysis of the model). In logic synthesis and design, transient behavior and redundant gate information may be leveraged to optimize a logic design and enhance characteristics (e.g., decrease silicon area, decrease power consumption, and increase clock speed) of an associated fabricated semiconductor device.

A variety of logic designs include transient logic that only has relevance during initial time-frames. In general, transient logic may be represented by: signals that settle to deterministic constants after some number of time-frames; and initialization inputs that are used to enumerate complex initial states, which become irrelevant after the initial states. A large percentage of logic designs (both industrial and benchmark) include transient logic that creates overhead during analysis. According to various aspects of the present disclosure, automated techniques are implemented to detect and eliminate transient logic. The automated techniques facilitate verification efficiencies in terms of greater logic reduction, deeper bounded model checking (BMC), and enhanced proof capability using (for example) induction and interpolation.

Automated verification of sequential hardware designs is a PSPACE (i.e., the set of all decision problems which can be solved by a Turing machine using a polynomial amount of space) problem that is often a computationally challenging task. Depending on the size of a logic design under verification, an automated solution may be intractable. Many logic (hardware) designs include extraneous artifacts, while being largely irrelevant to verification, create bottlenecks in the verification process. As is mentioned above, two particular types of artifacts are transient signals (which after a certain number of time-steps settle to a fixed constant value) and initialization inputs (which are used to encode intricate initial states that become irrelevant after a certain number of time-steps). According to aspects of the present disclosure, various techniques may be employed to automate the identification and elimination of transient signals and initialization inputs to enhance analysis. With reference again to FIG. 1, register 'C' is a transient register, as register 'C' takes the value '0' starting at time '2' and holds the value for all time. In contrast, registers 'A' and 'B' are not transient registers because both of the registers 'A' and 'B' remain undetermined in value and do not settle to a fixed constant value.

As previously noted, transient logic may be due to initialization logic that implements an initialization sequence. For example, a common design style allows a logic design to power-up in a non-deterministic state from which a sequence of state transitions bring the design to a 'reset state' from which the design behaves consistently. Commonly dedicated initialization logic is used to force a logic design through an initialization phase and, in this case, verification assumptions/checkers are usually tailored to take effect only upon completion of the initialization phase. As a majority of the initialization logic settles to a fixed constant value upon completion of the initialization process, initialization logic is amenable to elimination during analysis.

At least one conventional approach has proposed to reduce verification overhead by using three-valued simulations of an initialization phase (applying 'X' values to reflect non-determinism) to conservatively determine a set of states a logic design can reside in post-initialization. However, the conventional approach has required dedicated manual effort to decompose the overall verification process. In general, conventional approaches ultimately over-approximate the set of post-initialization states since the approaches conservatively treat non-deterministic signals as non-constant, losing more subtle constraints which may exist over the post-initialization states. The over-approximation may, in turn, prompt a logic designer to manually add initialization logic to avoid spurious failures which may result in sub-optimal fabricated semiconductor devices.

Verification constraints (constraints) are constructs that may be employed in design verification applications. A constraint may be implemented as a specially-labeled gate (i.e., a constraint gate) in a netlist of a design. In general, a constraint represents a limitation on the freedom of a verification tool to explore a state space of a design. For example, a constraint may prevent a verification application from exploring any 'j' time-step trace in which any of one or more constraints evaluate to a logical zero during any of the 'j' time steps. Typically, a constraint defines a portion of a state space of a design that is irrelevant for verification purposes and, as such, would unnecessarily consume verification resources if the constraint were verified. As one example of a constraint, 'a design may be constrained to prevent new transfers of data when a buffer is full'. In general, constraining inputs of the design to prohibit data transfers when the buffer is full means that a verification tool does not cover states that represent the design accepting new data transfers when the buffer is full.

In the absence of a constraint, a typical verification problem is stated as, for example, find a step trace that exhibits a violation of a property or prove that no such trace exists for any 'j'. With a constraint, the same verification problem may be expressed as, for example, find a 'j' step trace that exhibits a violation of a property and does not exhibit a logical zero value for any constraint in any of the 'j' steps, or prove that no such trace exists for any Because constraints alter the semantics of a verification problem, constraints have the potential to cause a property that could be reached by a design to become unreachable. As such, it is desirable to select constraints judiciously. In general, constraints should not alter semantics of a verification problem. A constraint, for example, that would prevent a verification tool from discovering a valid assertion of a signal should not be permitted. Because constraints prohibit the exploration of certain otherwise reachable states, redundancy removal algorithms may leverage constraints to enable greater gate merging. In particular, redundancy removal algorithms may merge gates that are equivalent in all states reachable along paths that do not violate any constraints, even if the merged gates are not equivalent in some states that are reachable only after violating a constraint.

A cutpoint gate may be introduced (into a modified netlist) by replacing a sequential gate in an original netlist with a random gate. An output of a random gate drives the same inputs in the modified netlist as an associated sequential gate drove in an original netlist. Unlike the inputs of the sequential gate in the original netlist, however, the inputs of the random gate are random inputs that are not connected to any other elements of the modified netlist. Inputs to a random gate can assume any value on any gate cycle irrespective of other stimulus applied to a design. As such, the net effect of introducing cutpoints into a netlist may be to over-approximate the behavior of a design, as a random gate can simulate behavior of the sequential gate, while the converse is not necessarily true. As an over-approximate model of an original netlist, a modified netlist may include states from which a target gate could not be asserted in the original netlist.

Retiming techniques, which were originally developed for enhanced synthesis, have more recently been proposed to enhance verification (i.e., reduce verification time) through reduction in latch (flip-flop) count. Generally speaking, retiming refers to the process of moving latches across combinational gates. In general, many prior art retiming algorithms have shifted every gate in a design under verification by an arbitrary amount, which may pose challenges to the use of retiming in a verification setting under the presence of constraints.

Transient logic may also be attributable to a verification testbench. In general, a testbench includes three components: a driver that includes enough input assumptions to provide meaningful input stimulus; a logic design under verification; and a checker to verify the correctness of the design under the given inputs. The testbench driver may be constructed to over-constrain the inputs of the design (e.g., to test the design only against a subset of possible design behaviors to facilitate a case-splitting strategy). Given a reduced set of inputs, various signals that would not normally settle to constant behavior may settle to constant behavior after a certain number of time-steps. One example of transient logic arising from a verification testbench may be found in a floating-point unit (FPU) verification approach that checks the correctness of a single opcode propagating through an empty pipeline. For example, when no-operation (NOP) opcodes are driven after a single opcode under evaluation, an internal state of the FPU settles to a constant NOP behavior. In this case, all signals in the FPU may be viewed as transient logic.

Transient logic may also be attributed to extraneous initialization inputs. As previously noted, it is common for designs to have a set of possible initial states. In this case, a testbench driver can non-deterministically select a single initial state (from the set of possible initial states) by introducing initialization inputs (to primary inputs). However, values of the initialization inputs are irrelevant after a first time-frame. According to an embodiment of the present disclosure, a technique is disclosed that identifies a subset of the initialization inputs that can be safely replaced with constant values, enhancing the ability to eliminate transients from designs without significantly increasing the total size of the design.

The techniques disclosed herein (which require relatively little runtime), optimize a logic design by injecting constants into the design. The disclosed techniques enable scaling to large industrial designs that would be intractable for conventional approaches. According to one embodiment of the present disclosure, a technique is disclosed that automatically detects the presence of transient initial behavior in a logic design (as well as a length of the transient initial behavior) and provides reduction (optimization) information for the design. According to another embodiment of the present disclosure, a technique is disclosed to decompose an analysis (e.g., a verification problem) into two parts: a check that the design behaves consistently during an initial phase (a first decomposed problem); and a check that the design behaves consistently after the initial phase (a second decomposed problem). In general, the techniques disclosed herein are applicable to formal verification, simulation, hardware acceleration, and synthesis.

According to yet another embodiment, a technique is disclosed to minimize a size of the second decomposed problem based on knowledge that the design is not operating in the initial phase. In general, minimizing a size of the second decomposed problem reduces design complexity and simplifies the second decomposed problem. Bounding the resources of the decomposition reduces the complexity of the two resultant decomposed problems and facilitates applicability of the technique to a wide variety of industrial designs. In general, the techniques provide optimization information that may be employed in a synthesis/design flow to improve efficiency of a fabricated semiconductor device in terms of reduced power consumption, reduced area, etc. Moreover, disclosed techniques further enhance the applicability of post-transient reductions in synthesis and further optimize verification analysis by reducing the size of the initialization structure generally necessary to exploit the post-transient reductions.

As one example, a technique that identifies the existence and duration of transient signals may employ ternary simulation (which is relatively fast and scalable). According to another embodiment of the present disclosure, transient logic may be eliminated (from the verification process) by decomposing an unbounded verification problem into two verification sub-problems (i.e., a bounded verification problem over initial time-frames during which transient behavior occurs and an unbounded verification problem over remaining time-frames). In this case, the unbounded verification problem can safely assume that all transients have settled to their post-transient constant values to simplify the unbounded verification problem.

According to aspects of the disclosure, a scalable technique to identify initialization inputs that can safely be replaced by constants uses bounded model checking (BMC) combined with structural analysis. In general, it is useful to eliminate initialization inputs that exist in a testbench for modeling power-on non-determinism. As the disclosed techniques for eliminating transient logic can create initialization inputs, a technique that eliminates initialization inputs may be advantageously implemented after transient logic is eliminated from the logic design.

In general, ternary simulation efficiently over-approximates the set of reachable states in a logic design. Ternary simulation works by conservatively modeling primary inputs with ternary 'X' values and simulating a sequence of 3-valued states until a state is repeated. Upon convergence, the set of observed 3-valued states constitutes an over-approximation to the set of reachable states. In an example ternary simulation run, where a state at time 'y' is repeated at time 'x+y', reachable states are over-approximated. While the over-approximation associated with ternary simulation is often too coarse for property checking, the over-approximation is useful to efficiently identify certain design characteristics. For example, certain constant and equivalent signals may be detectable (using ternary simulation), which facilitates design simplification. As another example, temporal phase abstraction may be facilitated by detecting clock-like oscillating signals with ternary simulation. Ternary simulation can also be readily augmented to efficiently detect a subset of the transient signals, in addition to the transient duration after which they settle to constant behavior.

A straight-forward implementation of the use of ternary simulation to find transient signals may be implemented through various techniques. After convergence, a sweep over all signals may be performed to determine which signals remained constant within a state-repetition loop (i.e., which signals are transient signals). The signals that remained constant within the state-repetition loop may then be added to a transient list (along with the constant the signals settled to) and the latest time-frame at which the signals evaluated to a non-constant value. In general, the latest time-frame at which a signal evaluated to a non-constant value represents an upper-bound (due to the over-approximation of ternary simulation) on the transient duration of the signal.

For example, the detection of transient signals may be implemented through the following function:

```
01:  function detectTransients(design)
02:      // Execute ternary simulation until convergence
03:      History := φ ;
04:      ternaryState := getTernaryInitialState(design)
05:      for (time = 0; ; time ++) do
06:          if (ternaryState ∈ History) then
07:              cycleStartTime := calculateCycleStartTime-
                     (History, ternaryState)
08:              break
09:          end if
10:          History := History ∪ ternaryState
11:          ternaryState := getNextTernaryState(design, ternaryS-
     tate)
12:      end for
13:
14:      // Extract the transient signals
15:      transients := φ ;
16:      for all (signals s in design) do
17:          for all (constants C in {0,1}) do
18:              if (∀ time > cycleStartTime, s = C) then
19:                  duration := latestToggle(s, History) // ≦
                        cycleStartTime
20:                  transients := transients ∪ (s, C, duration)
21:              end if
22:          end for
```

```
23:     end for
24:
25:     return transients
26: end function
```

In the above detectTransients function, prior to a maximum transient duration of each transient signal within a set of transient signals, one or more of the transient signals may assume a value which differs from a settled constant value. In this case, BMC may be employed to check the validity of any properties over initial time-frames. After the maximum transient duration, all transient signals in a set of transient signals have settled to their corresponding constant values. A logic design (embodied in a netlist) can then be simplified by replacing the transient signals with their respective constant values. An unbounded verification process can then be implemented to check the remainder of the time-frames in a simplified model of the logic design.

For example, an unbounded verification may be optimized within a transformation-based verification (TBV) framework. In a TBV framework, a sequence of transformations is applied to a logic design (embodied in a netlist) prior to the invocation of a terminal verification technique, allowing the reductions provided by the transformation to yield substantial speed-ups to the terminal verification technique. In this case, a transient simplification routine may be cast as a netlist transformation (rather than a customization to an existing verification technique) to facilitate compatibility with any downstream synthesis or verification techniques.

In general, there are numerous possible techniques that may be used to detect transients. Typically, it is desirable for a transient detection technique to exhaustively analyze a behavior of a netlist in order to ensure that a transient behavior that appears to terminate after a given time-frame does not, in fact, reoccur at a later time-frame. According to one embodiment of the present disclosure, ternary simulation is employed to over-approximate the behavior of a netlist. As another example, ternary simulation to detect transients may be implemented according to the analyzeTernarySim function (which is similar to the detectTransients function and is provided in pseudocode) set forth below:

```
function analyzeTernarySim (design) {
01:     currentState := initial state
02:     inputValues := "XXXXXX...."
03:     stateHistory := empty array
05:     transientSignals := empty array
06:     settledValues := empty array
07:     transientDurations := empty array
09:     for (timeStep := 0; ; timeStep := timeStep + 1) {
10:         //do one simulation step
11:         currentState := ternarySimulate(currentState, inputValues)
12:         X saturate
13:         //Look for transient signals that recently settled
14:         forall signals in design and not in transientSignals {
15:             if (signal == 0 in currentState or signal == 1 in
                     currentState) {
16:                 add signal to transientSignals
17:                 transientDurations[signal] := timeStep
18:                 settledValues[signal] := value of signal in currentState
19:             }
20:         }
22:         // Check that previously constant signals are still constant
23:         forall signals in transientSignals {
24:             if (value of signal in currentState != settledValues[signal]) {
25:                 if (signal == 0 in currentState or signal == 1
                         in currentState) {
26:                     transientDurations[signal] := timeStep
27:                     settledValues[signal] := value of signal in currentState
28:                 } else {
29:                     remove signal from transientSignals
30:                 }
31:         }
32:     }
34:     // Check for convergence
35:     if (stateHistory contains currentState ) {
36:         startLoopTime := time at which first occurrence of
                currentState was seen
37:
38:         //Discard signals that didn't settle soon enough
39:         forall signals in transientSignals {
40:             if (transientDurations[signal] > startLoopTime)
41:                 remove signal from transientSignals
42:         }
43:         hash value (modulo inversion) of all signals *not*
                in transientSignals
44:         create equivBuckets [signal] for each signal which
                matches > 1 hashed entry
45:         return (transientSignals, settledValues, equivBuckets,
                transientDuration);
46:     }
47:     add currentState to stateHistory
48: }
        }
```

With respect to the analyzeTernarySim function set forth above, in lines 1-3 the design is assumed to be in the initial state specified by the designer. If the initial state for a register is not given, the register is assigned value 'X', which indicates that the register could be either '0' or '1'. It is assumed that the design inputs could take any value (which is represented with a vector of 'Xs' for the inputs). The ternary simulation maintains a list (initially the list is empty) of all visible states. In lines 5 and 6, an assumption is made that there are no transient signals. As such, the settledValues and transientDurations arrays are empty. In lines 9-12, the temporal behavior of the design is explored by looping over all time-steps. In each time-step, the current state of the logic design is developed using ternary simulation. It should be appreciated that the state can be generalized using "X saturation" techniques, which facilitate relatively fast convergence of a ternary simulation routine.

In lines 13-20, at a current time-step, signals may assume constant '0' or '1' valuations. If a signal remains constant for all future points in time, then the signal is transient and the current time-step represents the transient duration. Transient tracking data structures are updated accordingly. In lines 22-32, all signals that were previously estimated to be transient have assumed a '0' or '1' valuation at the previous time-step. The function then checks that signals are at a same constant value at a current time-step. If a signal is not at the same constant value at the current time-step, the function refines the estimate of which signals are transient signals. In lines 34-44, if the current state is equal to the state seen at some previous time-step then the progression of states has looped, and all future states at all future times continue to follow the loop. As such, the function concludes that every possible state has been encountered and the function returns the list of found transient signals. With reference to lines 39-42, transient signals should have settled before the loop of states began. If this is true, a signal remains constant on the loop and, therefore, for all future points in time. If a signal settled too late, the signal is discarded from the transient signal list.

Moving to lines 43-44, an attempt is made to identify signals that are equivalent after the initial transient phase. For example, equivalent signals may be identified by using a hash table to record the values that every signal (other than those signals already identified as constants) exhibits during the post-transient phase. Signals that are equivalent after the transient phase will have the same values with respect to the hashed post-transient values. The comparison may be done using, for example, modulo-inversion to identify two signals that evaluate to opposite values during the post-transient behavior as redundancy candidates.

The ternary simulation technique is practical as the technique is relatively fast, scalable, and enables on-the-fly computation of signals that settle to constant values along with a simple post-processing technique to identify signals which settle to equivalent (or opposite) post-transient behavior. However, ternary simulation is over-approximate and, as such, is a lossy. Alternatively, one may use a more exact (less approximate) approach. For example, a binary decision diagram (BDD) may be employed to perform reachability analysis to identify all states which may be reached starting from the initial states of a logic design. During the reachability analysis, a BDD representing all states reachable at time '0' (initial states), time '1', time '2', . . . time 'j' may be maintained until no new states are discovered. Next, one may iteratively analyze the states reachable at time 'j', for each register (or alternatively, for every gate in the design) evaluating which are constant and which pairs are equivalent/ inverse in all states reachable at time j.

A constant time check is straight-forward through a linear (once per register/gate) probe of a resulting time T reachable state set, assessing whether the intersection of that reachable state set with the corresponding constant condition is empty. Determination of equivalent/inverse relationships are straight-forward through a quadratic (once per pair of registers/gates) number of intersection checks that the corresponding pair is equivalent/inverse. The check yields the set of redundancy candidates with transient duration 'j'. Alternatively, one may perform the analysis on the reached state sets for time 'i' . . . 'j', yielding a set of post-transient redundancy candidates with transient duration 'i'. As another alternative embodiment, the set of states reachable at any time may be over-approximated, as doing so may reduce analysis runtime.

Certain satisfiability-based techniques also yield over-approximate reachable-state set representations. For example, interpolation iteratively approximates the set of states reachable at times 0, 1, . . . 'j' using satisfiability analysis until it is determined that no additional states are encountered at time 'j'. The resulting state sets are often represented using a netlist type of representation. One may directly apply BDD-based analysis to the state set representations. Alternatively, one may use techniques for identifying redundancy in netlist circuits directly on the state set representation for time 'j' (or alternatively time 'i . . . 'j' as per the BDD-based technique) to identify post-transient redundancies.

In order to check properties after the transient duration using a general-purpose verification technique, it is usually necessary to time-shift the design. In this process, the time basis of the design may be adjusted such that time of the maximum transient duration (maxTransientDuration) in the original design corresponds to time '0' in the time-shifted design. In this case, an initial state of the design is modified such that the time-shifted design starts in any state reachable in maxTransientDuration time-steps. For example, the transformation may be achieved by unrolling the transition relation and driving the initial states with the output of the unrolled structure. This is similar to using structural symbolic simulation to compute a new set of initial values.

A relatively straight-forward procedure may then be employed that uses a set of detected transient signals to simplify the design. In this embodiment, BMC may be used to check the properties before the maximum transient duration. The design may then be time-shifted, and the netlist may be simplified by merging transient signals with respective settling constants. Runtime may be limited to a relatively low time 't', for example, ten seconds, as most of the benefits are usually obtained quickly. For example, simplification of transient signals may be implemented by the following function:

```
01: function simplifyTransients(design, transients)
02:     maxTransientDuration := computeMaxTransient-
        Duration(transients)
03:     for (t = 0; (t < maxTransientDuration); t++) do
04:         Validate that properties are not falsifiable at time t with BMC
05:
06:         //Time shift by 1 clock cycle
07:         for all (registers r ∈ design) do
08:             initialValue(r) := nextState(r)
09:         end for
10:
11:         // Incrementally simplify the design
12:         for all (g ∈ transients) do
13:             if (transients[g].settlingTime ≦ t) then
14:                 merge(design, g, transients[g].settledConstant)
15:             end if
16:         end for
17:     end for
18: end function
```

In the above simplifyTransients function, transients are replace with settle constants. One application of the above simplifyTransients function is to simplify verification (e.g., formal verification, simulation, or hardware acceleration) frameworks. Another approach to leverage post-transient redundancy information in verification is illustrated in the following decomposedVerification function (presented in pseudocode):

```
function decomposedVerification (design) {
01:     transientSignals := identify_posttransient_redundancies(design)
02:         if (transientSignals is empty )
03:             return "Cannot decompose verification "
04:         maxDuration := maximum amount of time any
                transientSignals are transient
06:     //Part 1 of the decomposed verification: bounded verification
        of the transient frames
07:     if (boundedVerification(design, maxDuration) ==
            "Counter-example Found")
08:         return "Counter-example Found"
09:     //Part 2 of the decomposed verification: unbounded verification
        of the simplified, time-shifted
        design
10:     design := timeShift(design, maxDuration)
11:     design := simplifyDesign(design, transientSignals)
12:     return unboundedVerification (design)
}
```

In lines 1-4 of the decomposedVerification function set forth above, an arbitrary technique may be employed to identify gates which exhibit redundancies after some initial transient period. In general, the analysis identifies both transient signals and a duration of the transient signals. If no transients are found, then no reduction opportunity exists. However, because of common design styles and common verification methodologies, transient signals are often found in practice. In this case, the function computes the maximum duration of all transients and, after the number of time-steps, the function concludes that all transients have settled to their constant values. In lines 7-8, the function checks that the design behaves correctly for the first #maxDuration time-steps after power-on. For example, correct design behavior may be checked using BMC. Due to the fact that maxDuration is usually relatively small, checking correct design behavior in this manner is readily scalable.

If a counter-example is found in the first time-steps, then the design does not behave as intended and the counter-example is returned for debugging purposes. Alternatively, one may use an under-approximate technique, such as simulation or hardware acceleration, in an attempt to find a counter-example. With reference to lines 10 and 11, a time reference for the logic design is advanced in time to the point where all transients have settled to their constant values. This can be done in several ways depending on the verification setting. For formal verification, time-shifting can be employed to ensure precise analysis results. For simulation or acceleration, a set of initial states reachable after the bounded verification period can be determined and a resulting simplified design can be initialized into the states for enhanced simulation or acceleration analysis. It should be noted that the netlist can be simplified in all these frameworks by replacing each transient signal with its respective constant value. With reference to line 12, the time-shifted and simplified design is then verified using an unbounded verification technique (e.g., induction, interpolation, explicit reachability, etc.). Typically, unbounded verification is extremely difficult. However, design simplification helps to reduce the complexity of the verification process. For some design styles, it is not possible to complete verification within a reasonable time limit without the simplification.

In general, a decomposed verification strategy is both sound and complete as a design that behaves incorrectly will have a valid counter-example that may be found using a decomposed verification. A correct design will have no such counter-example, and each decomposed verification problem will successfully complete. According to one or more embodiments, after transient signals have been detected and a bounded verification up to a maximum transient duration is complete, a time reference of the logic is shifted. An example timeShift function (that focuses on an exhaustive formal verification framework) is illustrated in the pseudocode set forth below:

---

```
    function timeShift(design, timeSteps) {
1:      unrolledDesign := concatenate #timeSteps transition relations
3:      for each register in design
4:          initialValue[register] := signal in unrolledDesign
            corresponding to register at time timeSteps
6:      return design
    }
```

---

With reference to line 1 of the timeShift function, a next state is determined as a function of a current state and a logic design input (referred to as a transition relation). A model of the design behavior for the first #timeSteps is constructed by concatenating transition relations. The registers in the time '0' transition relation are replaced with their designer-specified initial values (unrolled). The time 'K' instance of signal 'X' is a logic node that can assume any of the logic values that 'X' can assume in the original logic design after 'K' time-steps. With reference to lines 3 and 4, the initial state of each register is modified to come from the unrolled design to ensure that at time '0' a register in the modified logic design can assume any value possible at time #timeSteps in the original logic design. In this manner, the modified design is time shifted.

The timeShift and decomposedVerification functions are presented in exhaustive form for exact formal verification (i.e., the functions facilitate exhaustive analysis of time-frames which are to be shifted-forward to enable post-transient reductions) both for 'bounded verification' of the initial time-frames and 'unbounded verification' after the shifting. In some cases (e.g., when using an incomplete verification technique, such as simulation or hardware acceleration) it may be desirable to under-approximate the analysis. In frameworks that employ an incomplete verification technique, the bounded verification (boundedVerification) is optional. If performed, the bounded verification may also optionally use a simulation or hardware acceleration framework to directly under-approximately evaluate the netlist during the initial transient time-frames. Similarly, the timeShift function may be under-approximated to compute an arbitrary subset of states compatible with the resulting unrolled design (again using an arbitrary set of techniques, e.g., the simulation or hardware acceleration approach to be used for unbounded verification), and the under-approximate unbounded verification may be performed relative to the arbitrary subset of states. Following time shifting of all transient signals, constant values are assigned to the transient signals for all time. The transient signals can then be replaced with their respective constants, and constant propagation can be used to simplify the design.

A size of the unrolled logic created by the timeShift function may be minimized using any number of approaches. For example, unrolled logic may be minimized by the reduceUnrolledTimeShift function set forth below:

---

```
    function reduceUnrolledTimeShift (design) {
1:      for(i=0; NOT termination criterion ; i++)
2:          registerList = registers whose next-state functions are sensitized
            to other registers with nonconstant initial values due to timeShift
3:          perform boundedVerification at time "i"
4:          create unrolledDesign representing registerList valuations
            for time "i"
5:          perform an arbitrary set of reduction steps on unrolledDesign
6:          if any random gates no longer fanout to registerList, tie to an
            arbitrary constant
        }
    }
```

---

In the reduceUnrolledTimeShift function, logic is minimized by eliminating 'random' gates whose values are determined to be irrelevant to the analysis of the netlist within a certain number of time-frames. For example, 'termination criteria' may include any arbitrary stopping criteria to preclude the analysis of future time-frames, user-specified parameters, time, or memory limits, etc. It should be noted that in a purely synthesis framework (i.e., when attempting to use the technique to automatically optimize design representations for enhanced semiconductor devices (requiring less area, less power-consumption, etc.)) the need to represent symbolic non-constant initial values may preclude the ability to fully automate the synthesis procedure. In particular, automated equivalence checking to validate that synthesis does not alter design behavior may become difficult as an optimized netlist may correlate to a difficult-to-associate future time-frame of an original netlist. As such, it may be desirable to use resulting optimization potential as feedback to a designer who can then manually optimize a logic design accordingly, if the resulting optimized netlist has a symbolic initial state. However, in many cases the time-shift optimization technique disclosed herein is able to eliminate most, if not all, of the symbolic initial values, enabling seamless use of the technique for reduced power, area, etc. in an automated synthesis flow.

Unrolling initial states of a register may increase the size of the design, and despite the later constant propagation this technique may actually increase the design size overall. This can be overcome by incrementally unrolling the initial states and carefully monitoring the size of the design. Once the design size increases beyond a predetermined threshold, the unrolling may be discontinued. In this case, any transients with a duration longer than the amount that was unrolled should be discarded. In practice, this process facilitates leveraging a majority of the found transient signals without adversely affecting verification by increasing the design size unreasonably.

In general, some amount of size increase is acceptable. A logic design can be considered to be two pieces: logic that computes initial values for registers and is used only at time '0' and logic that is used for all time>0. The techniques disclosed herein may increase the initial value logic while decreasing the other logic. Many formal verification techniques (e.g., induction) only minimally utilize the initialization logic and from the perspective of these techniques an increase in the initialization logic is inconsequential. In simulation or hardware acceleration, logic bloat may not be relevant as a subset of time-shifted initial values are computed and reused.

Time shifting means that the modified design will not simulate any behavior from a predetermined number of time-steps. In order for formal verification to be sound, the early time-steps should usually be verified separately. The early time-steps (whose number is equal to the maximum transient duration) may be, for example, verified with BMC. If the number of time-steps is large, completing BMC within a reasonable time limit may not be feasible. This can be overcome by incrementally calling BMC to check each time-step individually. If computational resources are exceeded during any check then the full BMC problem cannot be completed. In this case, at least a subset of the initial time-steps have been checked. Transient signals with a duration exceeding what was checked can be dropped and verification decomposition using the remaining transient signals can proceed.

If a design does not behave as intended, a counter-example may be found while verifying the time-shifted model. In this case, the counter-example is also time-shifted. Care should be taken to unshift the counter-example so that the counter-example is reported to the user in terms of the original design and not the time-shifted intermediate representation. In specific, assuming that the netlist was time-shifted by 'k' time-steps, counter-example values from the sequential portion of a netlist should be time-shifted forward by 'k' time-frames to undo the effects of the transformation for overall verification. Additionally, values to logic used to represent the unrolled initial time-frames may be used to fill in the gaps entailed by the forward-shifting of sequential netlist valuations during these the 'k' time-frames.

Often verification engineers use constraints which indicate that the verification environment should only explore states of the design when specified conditions hold. After time-shifting the design, care should be taken to ensure that the constraints are honored in the time-steps that have been shifted away. This can be accomplished by transforming the constraints into complex restrictions on the unrolled initial values in the time-shifted design. In particular, by not only preserving the time-shifted constraint, but also by adding a constraint for each time-frame 0 ... k−1 (assuming an overall time-shift of 'k' time-steps) representing the value that the constraint would have at time '0' (i.e., over initial values of registers directly feeding the constraint), time '1' (over registers feeding the registers relevant at time '0'), ... using the unrolling procedure mentioned above.

As previously mentioned, some testbenches include initialization inputs to model complex initial values. Initialization inputs may also arise due to the symbolic simulation used in time-shifting netlists for the simplification of transient signals. A similar complexity of initial values occurs as a byproduct of peripheral retiming. The increase in size due to the time-shifted initial values is undesirable, in that it may offset the reduction in size resulting from the merging of transient signals to constants. While certain techniques (e.g., induction) may be immune to increases in initial value complexity, in a TBV setting some techniques may be hindered by the increased complexity. As previously noted, initialization inputs are inputs whose values only affect a logic design at time '0' and are often used to encode complex initial states. In general, time-shifting inherently introduces a significant number of initialization inputs. However, not all of the introduced initialization inputs may be relevant to design behavior. As such, a time-shifted design can usually be optimized by removing at least a subset of the introduced initialization inputs.

For example, in a design that can start in four possible initial states, two initialization inputs may be used to model the set of initial states. In the case that all paths in a state transition graph (STG) pass through a single dominator state after two time-steps, it is possible to reduce the number of possible initial states without affecting behavior of the design. As the set of initial values is represented in a netlist using extra initialization inputs, a simplification may be performed by replacing the initialization inputs by constants. This type of simplification is a form of observability don't care (ODC) based simplification as the individual initial states are not observable after a finite number of time-steps.

A subset of initialization inputs which are irrelevant to the behavior of a design may be detected using structural analysis alone. For example, a cone of influence (COI) analysis can be used to identify a subset of inputs that have no influence on the netlist after a fixed number of time-steps 't'. Once an irrelevant initialization input is identified, the irrelevant initialization input may be replaced with an arbitrary value without affecting the behavior of the design after time 't'. In this case, the modified design is usually guaranteed to be equivalent to the original design after time 't', but before time 't' the modified design can only visit a subset of the states of the original design. To ensure that valid counter-examples are not missed during simplification, it is usually necessary to validate the correctness of the properties up to time T, before the simplification.

For example, irrelevant inputs may be eliminated by the simplifyInputs function set forth below.

```
01:    function simplifyInputs(design, maxTime)
02:        unrolledModel := φ ;
03:        for all (registers r ∈ design) do
04:            instance of r in unrolledModel := initialValue(design, r)
05:        end for
06:        for (t = 0; t < maxTime; t++) do
07:            Validate that properties are not falsifiable at time t
08:
09:            // Incrementally unroll the model
10:            Append one transition relation to unrolledModel
11:            unrolledModel := resynthesize(unrolledModel)
12:
13:            // Compute the unrolled COI
14:            C := φ ;
```

-continued

```
15:        for all gates g ∈ (next-state functions ∪ properties) do
16:            C := C ∪ COI(unrolledModel, last temporal instance of g)
17:        end for
18:
19:        // Remove unnecessary inputs
20:        for all (primary inputs i ∈ 2 design) do
21:            if (i ∉ C) then
22:                merge(design, i, 0)
23:            end if
24:        end for
25:    end for
26: end function
```

The simplifyInputs function gradually increases time 't' until computational resources are exceeded. For each 't', a validation is performed to ensure that the properties cannot be falsified at that time-frame. Next, the design is incrementally unrolled and its COI is inspected. In order to reduce the size of the COI and enhance the reduction potential of the technique, synthesis techniques (Boolean satisfiability (SAT) sweeping, rewriting, etc.) may be employed on the unrolled design. In this case, inputs that fall out of the COI of the next-state functions and properties are removed from the design by merging them with the constant '0'. Unlike most ODC-based simplification routines, all simplifications identified by the function above are inherently compatible. The simplifications can be utilized simultaneously without interfering with one another, resulting in greater efficiency. Additionally, because the technique relies on the circuit structure it is highly scalable. However, as the technique is incomplete, some irrelevant initialization inputs may not be identified. The technique may be complemented by post-processing of traditional ODC-based simplification.

In general, the irrelevant input elimination technique reduces the overhead of the symbolic simulation necessary to compute the initial values of the time-shifted netlist produced in transient simplification. Usually, initialization input simplification is effective in mitigating logic bloat that is caused by transient simplification.

As noted above, a disclosed technique for eliminating irrelevant inputs employs BMC and structural analysis to remove initialization inputs. In general, the technique is relatively fast but does not identify all unnecessary initialization inputs and, as such, additional unnecessary initialization inputs may be identified by running a more thorough initialization input simplification routine following the above technique. The above technique is similar to traditional ODC-based optimization techniques in that it creates a side copy of a logic window of the design for each candidate simplification, assessing whether a particular simplification may be witnessed as altering design behavior with respect to that window. This particular technique was limited to assessing the validity of merging initialization inputs relative to a logic window of a configurable sequential depth.

In general, transient simplification primarily leverages ternary simulation and BMC, and initialization simplification leverages structural methods and BMC. These techniques are efficient and scalable, and most analysis can be performed incrementally. Both of the simplification techniques may be implemented to incrementally simplify the design over timeframes until a predetermined computational limit is exhausted.

The techniques described herein may be implemented in a verification tool that is built upon a TBV framework where various engines incrementally simplify complex properties before leveraging a terminal verification engine to attempt to solve the simplified problem. In a robust verification setting, it may be desirable to invoke interpolation both before and after the above simplifications to maximize the chances of obtaining a conclusive result.

The detection and simplification of sequentially equivalent signals, sometimes referred to as signal correspondence, is an effective way to reduce the size of a sequential logic design. Often these reductions either prove the safety properties or are effective in simplifying the problem for another downstream verification engine. The techniques disclosed herein are related to retiming in that both approaches time-shift the design and, as a byproduct, entail complicated initial values.

In various cases, time-shifting and simplifying transient signals may be crucial to completing a proof by induction and, therefore, the disclosed techniques may form a vital part of overall scalability of various verification methodologies. Particularly, in sequential equivalence checking (SEC), identification of internal points that are pairwise equivalent is highly desirable to ensure successful completion of an inductive proof of input/output equivalence. Many of the pairs of internal points are initially inequivalent due to power-on nondeterminism, and the inductive proof of input-output equivalence fails because the internal equivalences no longer hold. In general, transient elimination is more desirable than retiming in certain facets of SEC flows in that the scalability of SEC relies to some extent upon name-based and structure-based correlation of registers across the designs being equivalence-checked. However, retiming may arbitrarily alter register placement, diminishing the usability of SEC heuristics.

In general, this disclosure is concerned with two types of redundant information present in RT-level designs: transient signals and initialization inputs. Techniques to identify and remove both phenomena have been presented herein. The proposed techniques have been implemented in an industrial verification environment as a light-weight design simplification step prior to the invocation of heavy-weight formal verification techniques. Many safety properties in designs are not provable by interpolation. After the simplifications, additional safety properties were usually provable with interpolation. Applying the simplifications before signal correspondence provided improved reduction in AND gates and registers. The techniques disclosed herein are effective in simplifying designs after min-register retiming, reducing AND gates, registers, and inputs. Applying the disclosed simplification techniques as a pre-processing step tends to improve completion of an inductive proof of input/output equivalence on large industrial designs.

Figure 2:
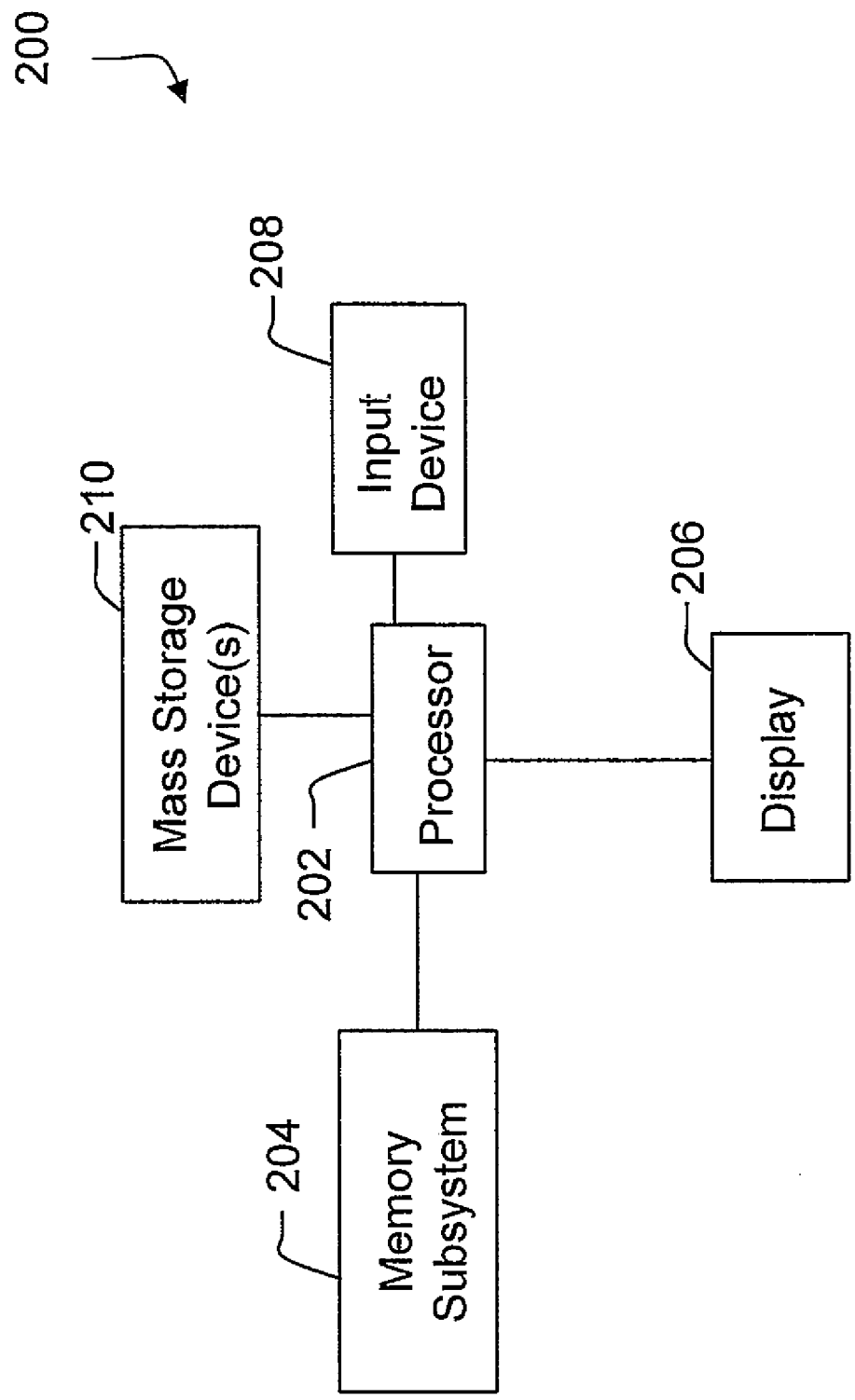
FIG. 2 is a diagram of an example computer system that may be employed to execute a tool configured according to the present disclosure.

With reference to FIG. 2, an example computer system 200 is illustrated that may be configured to execute a tool (configured to analyze an integrated circuit logic design (design)) that is configured according to various embodiments of the present disclosure. The computer system 200 includes a processor 202 that is coupled to a memory subsystem 204, a display 206, an input device 208, and mass storage device(s) 210. The memory subsystem 204 includes an application appropriate amount of volatile memory (e.g., dynamic random access memory (DRAM)) and non-volatile memory (e.g., read-only memory (ROM)). The display 206 may be, for example, a cathode ray tube (CRT) or a liquid crystal display (LCD). The input device 208 may include, for example, a mouse and a keyboard. The mass storage device(s) 210 (which may include, for example, a compact disc read-only memory (CD-ROM) drive and/or a hard disk drive (HDD)) are configured to receive or include discs that store appropriate code (e.g., an operating system (OS), an analysis tool, verification tool, etc.).

Figure 3:
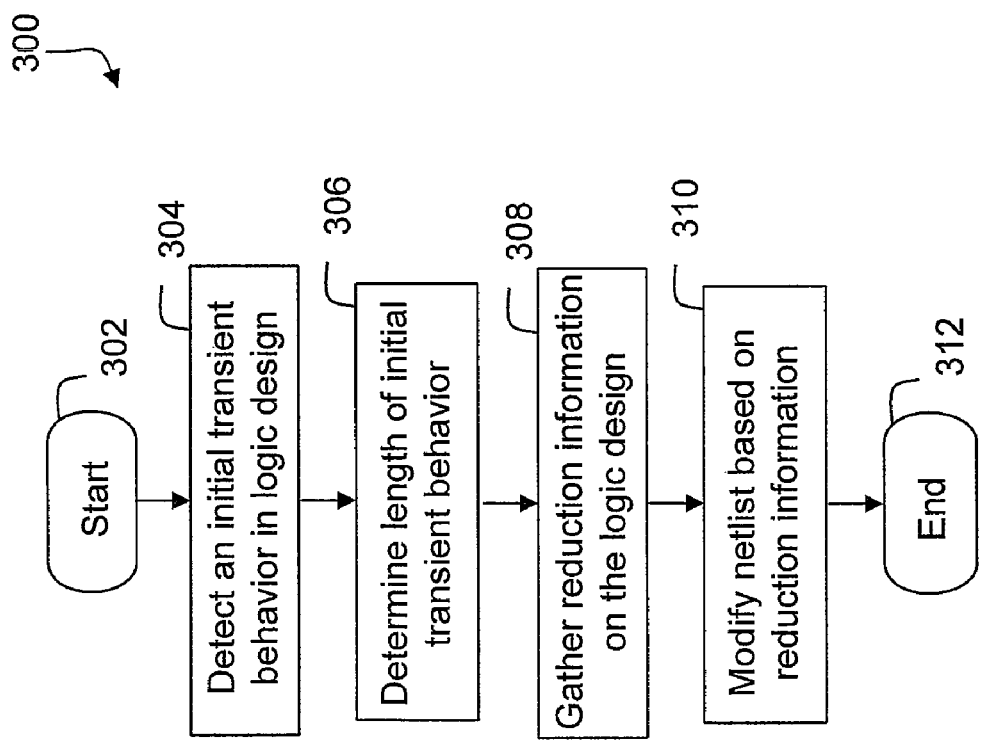
FIG. 3 is a flowchart of an example process for analysis of a design, according to yet another embodiment of the present disclosure.

With reference to FIG. 3, a process 300 (which may be implemented by one or more processors) for performing an analysis of a logic design (embodied in a netlist) is illustrated, the process 300 is initiated in block 302, at which point control transfers to block 304. In block 304, the process 300 detects an initial transient behavior in the logic design. Next, in block 306, a duration of the initial transient behavior is determined. Then, in block 308, reduction information on the logic design is gathered based on the initial transient behavior. Next, in block 310, the netlist is then modified based on the reduction information. Following block 310, control transfers to block 312 where control returns to a calling routine.

Accordingly, a number of techniques have been disclosed herein that generally reduce analysis (e.g., verification) time for integrated circuit logic designs.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to preferred embodiments thereof, it will be apparent that modifications and variations are possible without departing from the scope of the invention defined in the appended claims.

What is claimed is:

1. A method for performing an analysis of a logic design, comprising:
   detecting, using one or more processors of a data processing system, an initial transient behavior in a logic design embodied in a netlist;
   determining, using at least one of the one or more processors, a duration of the initial transient behavior;
   gathering, using at least one of the one or more processors, reduction information on the logic design based on the initial transient behavior;
   modifying, using at least one of the one or more processors, the netlist based on the reduction information;
   decomposing, using at least one of the one or more processors, a verification problem for the logic design into a first phase and a second phase, wherein the first phase corresponds to a start-up phase and the second phase corresponds to a phase that occurs after the start-up phase; and
   minimizing, using at least one of the one or more processors, the second phase of the verification problem based on knowledge that the logic design does not exhibit transient initial behavior in the second phase.

2. The method of claim 1, wherein the initial transient behavior is associated with one or more transient signals.

3. The method of claim 1, wherein the initial transient behavior is associated with one or more initialization inputs.

4. The method of claim 1, wherein ternary simulation is employed to detect the initial transient behavior in the logic design.

5. The method of claim 1, wherein the modifying the netlist includes eliminating transient logic from the logic design.

6. The method of claim 5, wherein the eliminating transient logic includes decomposing an unbounded verification problem into a bounded verification problem over initial time-frames during which the initial transient behavior occurs and an unbounded verification problem over post-transient time-frames that are subsequent to the initial time-frames.

7. The method of claim 6, further comprising:
   simplifying the unbounded verification problem over the post-transient time-frames by treating all transients as having settled to post-transient constant values.

8. The method of claim 5, further comprising:
   employing bounded model checking in conjunction with structural analysis to identify initialization inputs after the transient logic is eliminated.

9. The method of claim 1, wherein the transient initial behavior is detected using ternary simulation to over-approximate a behavior of the netlist.

10. The method of claim 1, further comprising:
    time-shifting, using at least one of the one or more processors, the netlist by a maximum transient duration to facilitate checking the logic design after the transient initial behavior.

11. The method of claim 1, wherein the analysis corresponds to one of formal verification, simulation, hardware acceleration, or synthesis.

12. A computer program product embodied on a computer readable storage medium, the computer program product including code that, when executed, is configured to cause a data processing system to:
    detect via ternary simulation an initial transient behavior in a logic design embodied in a netlist;
    determine a duration of the initial transient behavior;
    gather reduction information on the logic design based on the initial transient behavior; and
    modify the netlist based on the reduction information, wherein the modified netlist is stored in the data processing system, and wherein the code is configured to modify the netlist by eliminating transient logic from the logic design and decompose an unbounded verification problem into a bounded verification problem over initial time-frames during which the initial transient behavior occurs and an unbounded verification problem over post-transient time-frames that are subsequent to the initial time-frames, where the computer readable storage medium is a computer readable storage device.

13. The computer program product of claim 12, wherein the initial transient behavior is associated with one or more transient signals and one or more initialization inputs.

14. The computer program product of claim 12, wherein the code is further configured to simplify the unbounded verification problem over the post-transient time-frames by treating all transients as having settled to post-transient constant values.

15. The computer program product of claim 12, wherein the code is further configured to employ bounded model checking in conjunction with structural analysis to identify initialization inputs after the transient logic is eliminated.

16. The computer program product of claim 12, wherein the code is further configured to:
  decompose a verification problem for the logic design into a first phase and a second phase, wherein the first phase corresponds to a start-up phase and the second phase corresponds to a phase that occurs after the start-up phase; and
  minimize the second phase of the verification problem based on knowledge that the logic design does not exhibit transient initial behavior in the second phase.

17. A system configured for performing an analysis of a logic design, comprising:
  a memory subsystem; and
  one or more processors coupled to the memory system, wherein the one or more processors are configured to:
    detect an initial transient behavior in a logic design embodied in a netlist;
    determine a duration of the initial transient behavior;
    gather reduction information on the logic design based on the initial transient behavior; and
    modify the netlist based on the reduction information, wherein the netlist is modified to eliminate transient logic and initialization inputs, and wherein the modified netlist is stored in the memory subsystem, where the one or more processors are also configured to decompose an unbounded verification problem into a bounded verification problem over initial time-frames during which the initial transient behavior occurs and an unbounded verification problem over post-transient time-frames that are subsequent to the initial time-frames.

* * * * *